(12) United States Patent
White et al.

(10) Patent No.: US 8,392,864 B2
(45) Date of Patent: Mar. 5, 2013

(54) METHOD AND SYSTEM FOR MODEL-BASED ROUTING OF AN INTEGRATED CIRCUIT

(75) Inventors: David White, San Jose, CA (US); Eric Nequist, Monte Sereno, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 12/979,064

(22) Filed: Dec. 27, 2010

(65) Prior Publication Data
US 2011/0093826 A1    Apr. 21, 2011

Related U.S. Application Data

(60) Division of application No. 11/768,839, filed on Jun. 26, 2007, now Pat. No. 7,861,203, which is a continuation-in-part of application No. 11/648,150, filed on Dec. 29, 2006, now Pat. No. 7,698,666.

(51) Int. Cl.
*G06F 17/50* (2006.01)

(52) U.S. Cl. ......... 716/126; 716/110; 716/111; 716/132
(58) Field of Classification Search .......... 716/110–112, 716/119, 126, 132
See application file for complete search history.

(56) References Cited

U.S. PATENT DOCUMENTS

| | | | | |
|---|---|---|---|---|
| 6,209,123 | B1 * | 3/2001 | Maziasz et al. | 716/123 |
| 7,434,188 | B1 * | 10/2008 | Devgan et al. | 716/132 |
| 7,620,922 | B1 * | 11/2009 | Wadland et al. | 716/132 |
| 7,627,847 | B1 * | 12/2009 | Scheffer | 716/126 |
| 2007/0106969 | A1 * | 5/2007 | Birch et al. | 716/6 |
| 2007/0106971 | A1 * | 5/2007 | Lien et al. | 716/13 |

* cited by examiner

*Primary Examiner* — Paul Dinh
(74) *Attorney, Agent, or Firm* — Vista IP Law Group, LLP

(57) ABSTRACT

Disclosed is a method, system, and computer program product for implementing model-based floorplanning, layout, placement, and routing. Models are used to guide the placement and routing of polygons on the IC layout based upon predictions of manufacturing variations.

22 Claims, 11 Drawing Sheets

METHOD AND SYSTEM FOR MODEL-BASED ROUTING OF AN INTEGRATED CIRCUIT

CROSS-REFERENCE TO RELATED APPLICATIONS

The instant Application constitutes a divisional application of U.S. application Ser. No. 11/768,839 which is entitled "METHOD AND SYSTEM FOR MODEL-BASED ROUTING OF AN INTEGRATED CIRCUIT" filed on Jun. 26, 2007 and is a continuation-in-part of U.S. application Ser. No. 11/648,150, now U.S. Pat. No. 7,698,666, filed on Dec. 29, 2006 and entitled "METHOD AND SYSTEM FOR MODEL-BASED DESIGN AND LAYOUT OF AN INTEGRATED CIRCUIT". The contents of both applications are hereby expressly incorporated by reference in their entireties.

BACKGROUND AND SUMMARY

The invention is directed to a more efficient approach for implementing floorplanning, layout, placement, and routing of integrated circuit designs.

A semiconductor integrated circuit (IC) has a large number of electronic components, such as transistors, logic gates, diodes, wires, etc., that are fabricated by forming layers of different materials and of different geometric shapes on various regions of a silicon wafer.

Many phases of physical design may be performed with computer aided design (CAD) tools or electronic design automation (EDA) systems. To design an integrated circuit, a designer first creates high level behavior descriptions of the IC device using a high-level hardware design language. An EDA system typically receives the high level behavior descriptions of the IC device and translates this high-level design language into netlists of various levels of abstraction using a computer synthesis process. A netlist describes interconnections of nodes and components on the chip and includes information of circuit primitives such as transistors and diodes, their sizes and interconnections, for example.

An integrated circuit designer may uses a set of layout EDA application programs to create a physical integrated circuit design layout from a logical circuit design. The layout EDA application uses geometric shapes of different materials to create the various electrical components on an integrated circuit and to represent electronic and circuit IC components as geometric objects with varying shapes and sizes. After an integrated circuit designer has created an initial integrated circuit layout, the integrated circuit designer then verifies and optimizes the integrated circuit layout using a set of EDA testing and analysis tools. Verification may include, for example, design rule checking to verify compliance with rules established for various IC parameters.

Typically, geometric information about the placement of the nodes and components onto the chip is determined by a placement process and a routing process. The placement process is a process for placing electronic components or circuit blocks on the chip and the routing process is the process for creating interconnections between the blocks and components according to the specified netlist.

Based upon this geometric information, photomasks are created for lithographic manufacturing of the electronic product. A photomask, or more simply a "mask," provides the master image of one layer of a given integrated chip's physical geometries. A typical photolithography system projects UV light energy on to and through the mask in order to transmit the mask pattern in reduced size to the wafer surface, where it interacts with a photosensitive coating on the wafer.

Other processes may also occur during the process of manufacturing an intenerated circuit. For example, etching, Electroplated copper deposition (ECD), and chemical mechanical polishing (CMP) may be used to form interconnects for the IC. The lithographic patterns define the dimensions of the circuitry that is transferred to a silicon wafer, with the patterns subsequently used with the etch process to physically etch the features into the wafer surface or other thin films deposited on the wafer surface. Etch equipment includes mechanisms to selectively remove materials (e.g. oxide) from a wafer surface or thin films on the wafer surface patterned with lithography equipment. ECD is a process step in a copper damascene flow that is used to deposit copper material within the interconnect structures.

However, significant variations may arise during the process of manufacturing the IC. For example, lithography mask creation and printing assume that projection is done on a film, within a predetermined depth of focus range. However pattern dependencies between the process by which the ICs are fabricated and the pattern that is being created often cause processed films to have significant variation in thickness across a surface, resulting in variation in feature dimensions (e.g. line widths) of ICs that are patterned using the mask.

Variations in feature density, widths, and heights may also occur during the CMP and plating processes. Variations based upon CMP and plating process are often caused by oxide loss, dishing, erosion, or other copper losses. For ECD, the goal is to completely fill an etched trench region in a void-free manner while minimizing a variation in the deposited copper thickness and minimizing a variation in surface topography. There may exist pattern-dependencies in ECD that result in plated surface variation. Film thickness variation in CMP processes can be separated into various components: lot-to-lot, wafer-to-wafer, wafer-level, and die-level. Often, the most significant component is the pattern dependent die-level component. Die-level film thickness variation is often due to differences in layout patterns on the chip. For example, in the CMP process, differences in the underlying metal pattern result in large long-range variation in the post CMP film thickness, even though a locally planar surface topography is achieved.

As successive non-conformal layers are deposited and polished, the variation becomes worse. The variations may lead to numerous problems and flaws in a manufactured IC, such as timing failures, decreased performance, and increased power consumption. As just one example, because interconnect lines and connections on higher layers carry power to portions of the chip, the variations can increase the sheet resistance and thus affect the power effectiveness of the chip.

Thickness variation is one example of a type of topological variation that may occur based upon the manufacturing processes for an integrated circuit. Thickness variations may cause numerous problems for the structures in the IC, such as routing structures. For example, thickness issues may result in resistance based effects for the IC interconnects, which causes higher delays and timing problems for the chip. In addition, polishing effects may affect thickness resulting in capacitance problems for the manufactured chip. Thickness variations may create polishing problems, such as copper pooling problems, which actually result in short circuits within the chip.

Conventional EDA systems fail to take manufacturing variations into account when performing layout, floorplanning, placement, and routing functions. For example, conventional routers fail to take thickness variations into account when performing routing functions. This is quite problematic since, as noted above, thickness variations could cause operational or yield problems with the manufactured IC chip.

Therefore, there is a need for an improved method and system for implementing IC designs that limits the amount of resources consumed by DRC (design rule checking) processing.

The present invention is a method, system, and computer program product for model-based method for layout, floorplanning, placement and routing. Models are used to guide the placement and routing of polygons on the IC layout. In effect, the parameters that are used for placement and routing are guided by the model data so that the layout can be formed with a high degree of manufacturability from the outset. The present invention overcomes the limitations of conventional by considering manufacturing-based variations when implementing or modifying a layout, floorplan, placement, or route. With regard to routing, the variation analysis, e.g., thickness variation analysis, is used to either optimize routes or perform verification upon routes.

DETAILED DESCRIPTION

The present approach is directed to a model-based method for floorplanning, layout, placement and routing. As used herein, the term "Model" refers to a set of data that identifies one or more specific characteristics within an IC layout and data relating to its effect, manufacturability, and/or usability. For example, a model may present a defined characteristic such as "spacing" and a chart or numeric data indicating the probability of failure/success at different spacing values.

Figure 1:
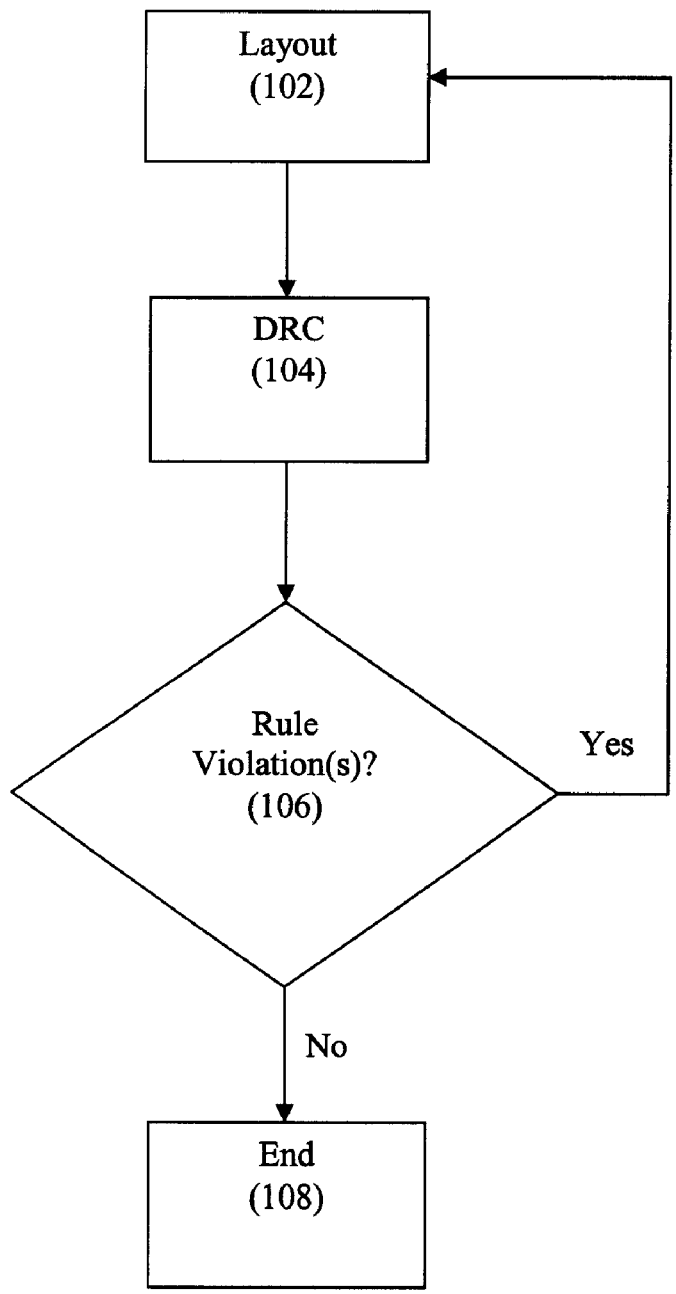
FIG. 1 shows a flowchart of conventional layout processing with DRC.

FIG. 1 shows a flowchart of a conventional process for performing electronic design using conventional non-model approaches. Conventionally, Physical Verification (PV) is one of the final steps that are performed before releasing an IC design to manufacturing. A key component of conventional PV includes the process of Design Rule Check (DRC) to ensure that the design abides by all of the detailed rules and parameters that the foundry specifies for its manufacturing process. Violating a single foundry rule can result in a silicon product that does not work for its intended purpose. Therefore, it is critical in conventional tools that thorough DRC processing is performed before finalizing an IC design. The process begins with the completion of a layout using a place and route tool (102). Once the layout is complete, DRC processing is performed on the layout to identify any rule violations that may exist within the layout (104).

The DRC produces either a "violation" or "no violation" result for each rule that is checked against the layout. Essentially, each rule is associated with one or more parameter values that are checked for compliance with the rule. The DRC process will check those parameters to produce a simple "yes" or "no" answer as to whether the rule has been violated. For example, a very common rule is to check for minimum spacing between objects in a layout. DRC processing will determine whether all objects meet the minimum spacing requirements. If all objects meet the spacing requirements, then the layout meet the rules requirement for spacing. If any objects are spaced closer together than the minimum spacing requirement, then the rules violation will be identified.

If there are any rules violations (106), and then the process will modify the layout to correct the rules violation (102). If no rules violations have been identified, then the IC design is passed to the next design stage for manufacturing (108).

DRC tools typically read and manipulate a design database which stores information about device geometries and connectivity. Because compliance with design rules generally constitutes the gating factor between one stage of the design and the next, DRC tools are typically executed multiple times during the evolution of the design and contribute significantly to the project's critical path. Therefore, reducing DRC tool execution time makes a major contribution to the reduction of overall design cycle times.

As the quantity of data in modern IC designs become larger and larger over time, the execution time required to process DRC tools upon these IC designs also becomes greater. The goal of reducing PV tool execution time is in sharp tension with many modern IC designs being produced by electronics companies that are constantly increasing in complexity and number of transistors. The more transistors and other structures on an IC design the greater amounts of time that is normally needed to perform DRC processing. This problem is exacerbated by constantly improving IC manufacturing technologies that can create IC chips at ever-smaller feature sizes, which allows increasingly greater quantities of transistors to be placed within the same chip area, as well resulting in more complex physical and lithographic effects during manufacture.

In addition, DRC rules often contain design constraints that are much more limiting than are needed for any particular design or portion of a design. DRC rules are often set at the "lowest common denominator" level to ensure that most or all IC designs will properly operate. However, certain IC design may actually need parameters that are more or less cautious than other designs. Since DRC rules typically operate on an "all or nothing" basis, this means that many IC design may fail DRC processing even though they would function properly for intended purposes if manufactured.

With the present invention, models are used to guide the placement and routing of polygons on the IC layout. In effect, the parameters that are used for placement and routing are guided by the model data so that the layout can be formed with a high degree of manufacturability from the outset. The parameter values can be selected based upon the specific type of design that is being operated upon, so that the layout is optimized for the specific circuit being designed. This can significantly improve upon the "one size fits all" approach used by conventional tools.

Figure 2:
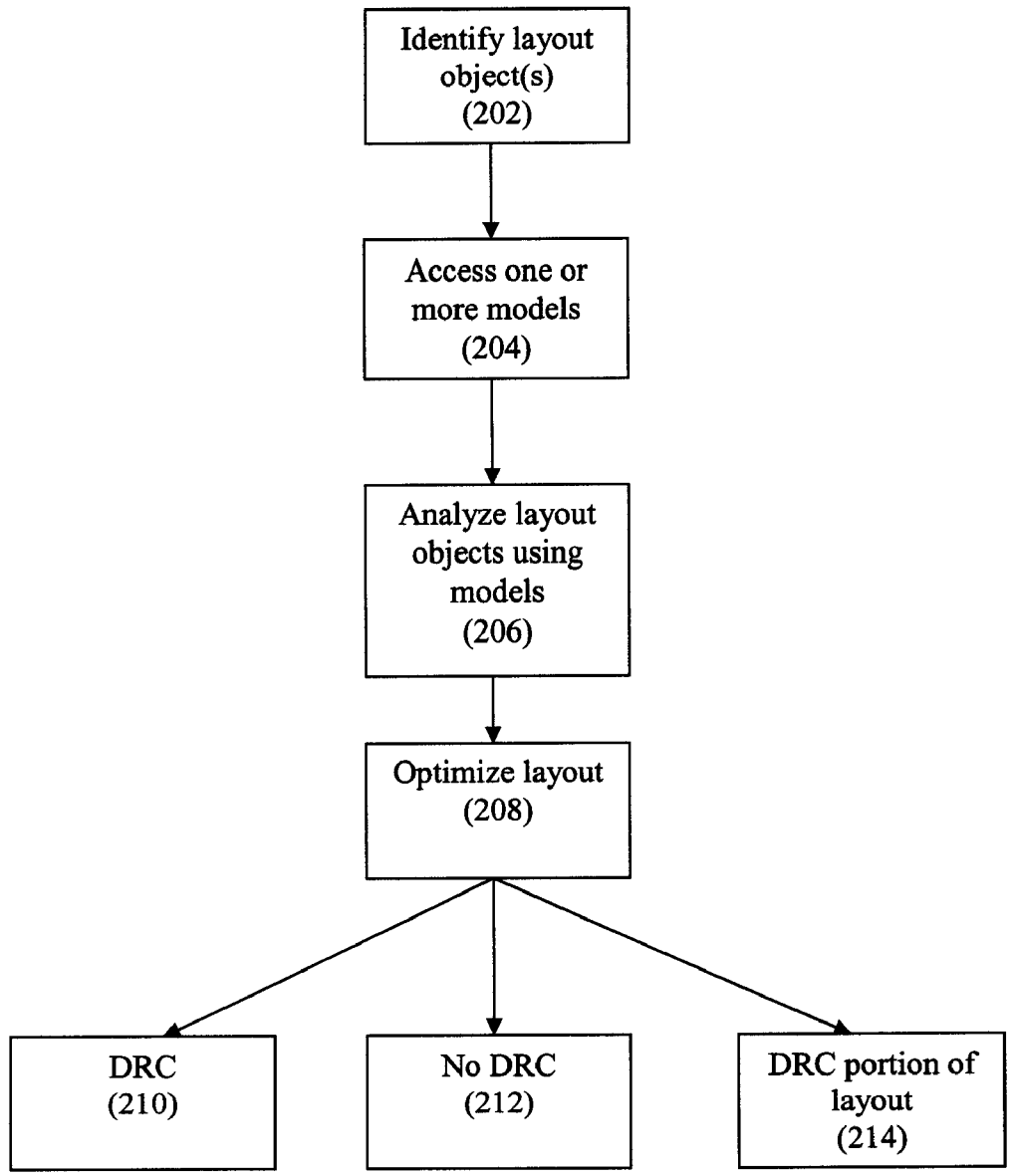
FIG. 2 shows a flowchart of a process for model-based layout according to some embodiments of the invention.

FIG. 2 shows a high-level flowchart of a process for performing model-based processing according to one embodiment of the invention. The first action is to identify the layout objects to process (202). In some embodiments, the present processing is performed upon implementation of an original layout. Therefore, the processing actions are used to perform placement and routing as part of a layout/place and route tool for an original IC design. Alternatively, the present processing may be performed to optimize an existing layout. Therefore, for this alternate approach, an existing layout is received for processing.

In some embodiments, the entire layout is handled using model-based processing. In alternate embodiments, certain different portions of the layout are handled differently than other portions of the layout, with only part of the layout being handled with model-based processing. Some portions of the layout may be more critical or important than other portions of the layout. It is contemplated that the more critical or importance portions of the layout may be associated with enhanced resources or processing. Some of the enhanced resources that may be directed to more critical or important portions may include more accurate or detailed models, as well as increased processing resources (e.g., CPU or central processing unit and memory resources).

The sensitivity of a layout, layout object, or layout portion provides one gauge that can be used to measure the criticality or importance of the layout and its contents. The term "sensitivity" refers to the importance or criticality of any given portion of the layout. A layout portion may correspond to high sensitivity for a number of different reasons. For example, high sensitivity may be associated with a layout portion that is subject to increased risks of variability based upon the contemplated manufacturing process, which can be determined, e.g., based upon manufacturing models. High sensitivity may also be associated with layout portions that correspond to increased risks of yield issues, e.g., based upon review of lithography models. Higher sensitivity may also be associated with areas subject to increased risk of functional failures, e.g., objects corresponding to critical logic structures or critical nets.

Once the layout objects to be operated upon have been identified, one or more models are accessed to perform the layout processing (204). Examples of such models include manufacturability models, CMP (chemical metal polishing) models, lithography models, and electrical models.

The identified layout objects are analyzed using the models to guide placement and/or routing of those objects on the layout (206). Using the models, patterns in the layout are analyzed to provide a measure or score for the placement options of the layout objects. In this way, the IC design can be laid out, placed, and routed in a manner that ensures proper manufacturability, yield, and/or functionality. During placement and routing, the geometric shapes forming the design are established in a manner that will be manufactured properly. These shapes and interactions between shapes are checked by comparing against the model data. Only configurations which will form a correct final design will remain in the design during the place and route process. Any erroneous configurations will be caught during placement and routing, and corrected at this stage. In this manner, no further DRC is required after placement and routing.

Unlike the conventional DRC approach, the result of this analysis action is not merely a "yes" or "no" regarding the advisability of a given layout. Instead, multiple sets of model parameters can be used to provide relative scoring for different configurations of the layout objects, allowing one to not only select an acceptable layout, but to actually optimize the placement of objects for the layout. In this manner, the model data guides the layout process so that the layout can be formed with a high degree of manufacturability from the outset. The parameter values can be selected based upon the specific type of design that is being operated upon, significantly improving upon the "one size fits all" approach used by conventional tools.

In one embodiment, a library of recommended shapes and configurations of shapes will be maintained. This library includes design portions that have already been established as being manufacturable and operational based upon models and/or as confirmed by real world test data. During placement and routing, the EDA tool will if at all possible select from these recommended shapes and configurations of shapes. This further establishes the correctness of the design during the placement and routing stage.

Based upon the above analysis action, the layout is optimized (208). Proposed changes based upon analysis and scoring are reviewed for implementation. This action finalizes the layout to implement the layout configurations that achieves expected manufacturability, yield, and functionality scores.

The present invention could be used to completely or partially eliminate the need for DRC processing. DRC rules are established based upon testing that occurs from fabrication facilities and tool makers. Those baseline test results are typically used to establish rules and parameters that seek a low failure threshold for any type of design. However, those underlying test results and models also form the underlying set of data for determining the adequacy of any given IC design or a portion of an IC design.

In the present embodiment, placement and routing already use those models (or similar models) to ensure correct design from the outset that is specific to the design under consideration. Therefore, the model-based layout should already meet expected goals for which the DRC rules are designed to ensure. As such, it is likely that some or all of the layout does not require an additional DRC stage to ensure such correctness. Moreover, since the layout has been optimized based upon the models, the layout should provide a more appropriate level of performance and manufacturability than the minimal levels being checked for by the DRC rules.

In the embodiment shown in FIG. 2, three possible actions may be taken with regard to DRC. One approach is to perform DRC on the layout to ensure compliance with the DRC rules. The possible drawback with performing DRC is that it is possible the model-based approach may result in a layout which meets manufacturing goals, but which has more aggressive design features than is permitted by the overly conservative DRC rules. For example, it may be decided that a given layout configuration may include spacing that is smaller than the minimum spacing allowed by DRC rules, e.g., for less sensitive portions of the layout. Therefore, in one embodiment, the DRC approach of (210) may be modified to allow exceptions for model-based layout portions that meet manufacturing goals but do not satisfy DRC rules.

Another approach is to assume that model-based layout is acceptable and to forgo DRC checks against the model-based layout, or at least against the layout portions that received model-based processing (212). A final option is to perform DRC against only some of the layout, but to forgo DRC against other portions of the layout. This embodiment may also be used to only apply DRC for some rules but not for other rules. The determination of which layout portions to receive DRC or which rules to apply could be based upon any criteria, e.g., the sensitivity of a given layout portion or based upon which layout portions received model-based processing.

Figure 3:
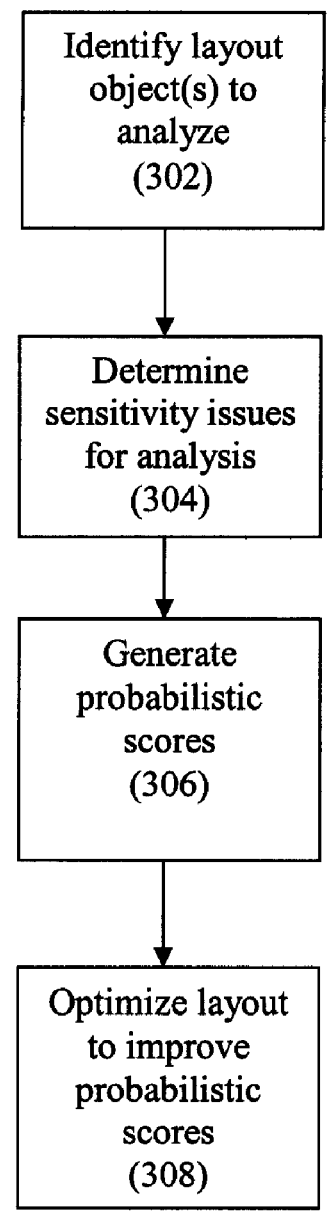
FIG. 3 shows a flowchart of a process for using models to analyze layout components according to some embodiments of the invention.

FIG. 3 shows a detailed flowchart of a process to implement the analysis action(s) of FIG. 2. The first action is to identify the specific layout object so the analyzed (302). As noted above, this action is partially determined by whether all or part of the layout is to undergo model-based processing.

Sensitivity issues may be to guide the analysis regarding particular portions of the layout (304). The models may be used to determine the sensitivity of some or all of the layout portions. Higher sensitivity potions of the layout may receive enhanced resources as compared to lower sensitivity portions of the layout. For example, more accurate models may be needed to process higher sensitivity portions of the layout, whereas less accurate models may be sufficient to process lower sensitivity portions of the layout.

The layout portions are analyzed to generate probabilistic scores for each identified layout portion and configuration combination (306). The scoring provides a measure of the probability of manufacturing results for a given combination of parameters. This can be used to provide an estimate of the viability of a layout as well as the statistical possibility of the predicted result actually occurring, with the accuracy of the estimate based upon the accuracy of the source models. One approach is to provide a percentage value for the particular scoring parameters being examined, e.g., "99.8 percent yield probability" and "92 percent variability probability."

By comparing the scores for different combinations, the process can be used to identify the optimal combination of factors and parameters for a selected design, process, and manufacturing goal (308). In addition, predictive analysis can be performed to estimate scores for a range of possible combinations. The range of possible combinations can be compared to identify the specific layout pattern that is expected to not only meet stated manufacturing goals, but to also produce an optimal result.

Figure 4:
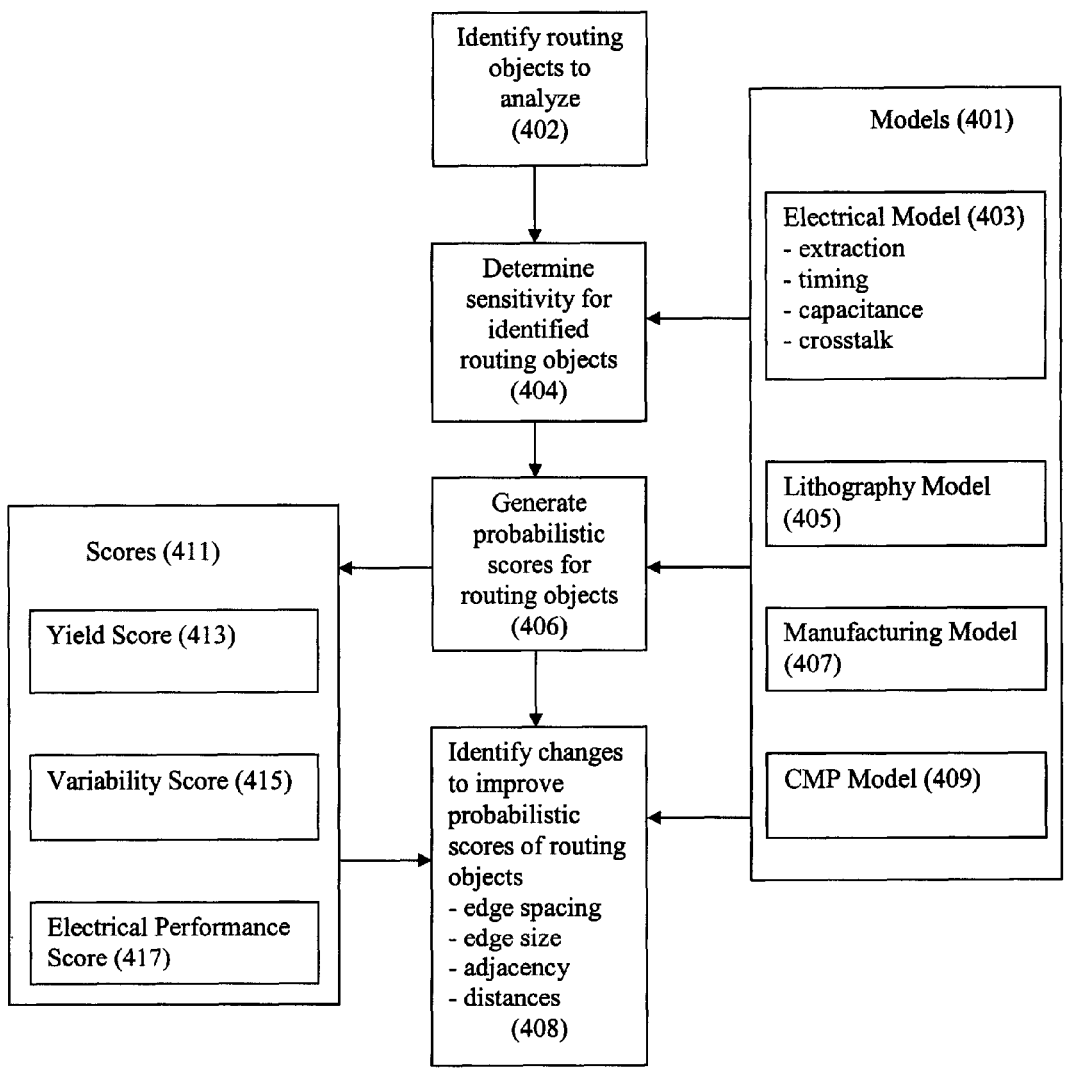
FIG. 4 shows a flowchart of a process for model-based routing according to some embodiments of the invention.

FIG. 4 shows a flowchart of a detailed embodiment for implementing model-based routing. The first action is to identify the routing objects that need to be analyzed (402). As noted above, this action is partially determined by whether all or part of the layout is to undergo model-based processing. In addition, this action is affected by the sensitivity analysis that will also be performed in conjunction with the models.

A number of different models (401) may be used to perform model-based routing. Some examples of models (401) that may be used include electrical models (403), lithography models (405), manufacturing models (407), and CMP models (409). The electrical models are used to identify data and equations relating to probable or possible electrical effects for electronic components in the layout. Example information/models that may exist in the one or more electrical models (403) include extraction information, timing information, capacitance information, and crosstalk information. Example information that may exist in the lithography models (405) include test and modeling data based upon specific fabrication processes for given fabrication facilities relating to various test data relating to lithography can layout parameters, such as spacing, dimension, width, and edge parameters. Example information that may exist in the manufacturing models (407) include test and modeling data based upon manufacturing parameters resulting from or used in fabrication and manufacturing processes. The CMP models (409) include test and modeling data based upon CMP related parameters for different CMP processes, facilities, and parameters.

Sensitivity calculations are performed using the models to identify which routing objects are to be addressed and how those identified routing objects should be addressed (404). The sensitivity of some or all of the routing objects may be determined using the models. As noted above, high sensitivity may be associated with a layout portion that is subject to increased risks of variability based upon the contemplated manufacturing process. Higher sensitivity may also be associated with areas subject to increased risk of functional failures. For example, routing structures that are associated with a critical net may be subject to higher sensitivities as compared to routing objects associated with non-critical nets. The sensitivity of some routing components may be affected by the objects in the neighborhood of that object. For example, narrow wires near wide objects may have different sensitivities to spacing and yield effects than the same narrow wire that is nearby another narrow wire. As another example, a power line object may normally be considered of low sensitivity, but that same power line object may be subject to higher sensitivities if placed near a critical net. Design intent may also be used to identify the sensitivity measure of an object. For example, the non-functional logo portion of a layout may be associated with a very low sensitivity measure since it is entirely non-functional by design.

Higher sensitivity potions of the layout may receive enhanced resources as compared to lower sensitivity portions of the layout. For example, more accurate models may be needed to process higher sensitivity portions of the layout, whereas less accurate models may be sufficient to process lower sensitivity portions of the layout.

The routing objects are analyzed to generate probabilistic scores for each identified layout portion and configuration combination (406). The scoring provides a measure of the probability of manufacturing results for a given combination of parameters. This can be used to provide an estimate of the viability of a layout as well as the statistical possibility of the predicted result actually occurring, with the accuracy of the estimate based upon the accuracy of the source models.

A number of types of probabilistic scores (411) may be used to perform model-based routing. Some example types of scores (411) that may be used include yield scores (413), variability scores (415), and electrical performance scores (417). The yield scores (411) provide a measure of the probability of a given yield result begin achieved with a particular routing configuration. The variability scores (415) provide a measure of the probability of a certain amount of manufacturing variance with a specified routing configuration. The electrical performance scores (417) provide a measure of the probability of certain electrical performance characteristics being achieved with a particular routing configuration.

By comparing the scores for different combinations, the process can be used to identify the optimal combination of factors and parameters for a selected design, process, and manufacturing goal (408). Predictive analysis can be performed to estimate scores for a range of possible combinations. The range of possible combinations can be compared to identify the specific layout pattern that is expected to not only meet stated manufacturing goals, but to also produce an optimal result.

Potential changes may be effected to improve the scoring for a layout. For routing structures, examples of such layout changes may include changes to edge spacing, edge size, object adjacency, and object distances. Changes to these and other parameters can be analyzed to determined expected changes, both good and bad, to the scoring. The optimal set of configurations, and changes if any, are applied to achieve expected optimal routing.

Some embodiments of the invention analyze predicted variations to perform layout, floorplanning, placement, and routing. For purposes of illustration and not by way of limitation, the following description explains one or more embodiments of the invention with respect to routing activities. It is noted, however, that the invention is not limited to routing unless claimed as such, and is applicable to other electronic design activities such as layout, floorplanning, and placement as well.

Figure 5:
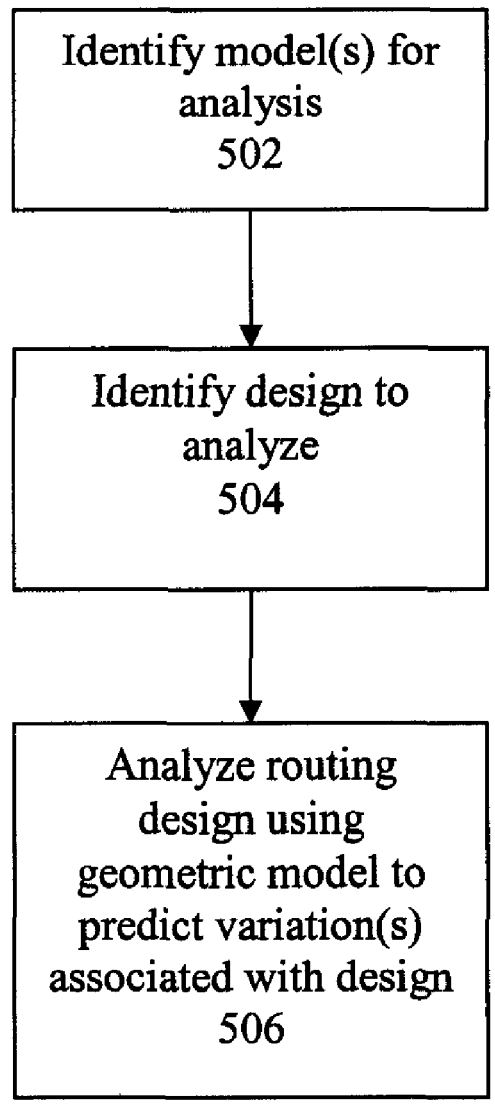
FIG. 5 shows a flowchart of a process for model-based routing according to some embodiments of the invention.

FIG. 5 shows a high level flowchart of a method for routing based upon an awareness and analysis of manufacturing variations. At 502, the process identifies one or more models that will be used for the analysis. This includes the action of identifying which of the manufacturing processes will be analyzed for variations, and then selecting appropriate models in order to perform that analysis. Examples of manufacturing processes that may be considered when predicting variations include CMP, lithography, plating, and etching processes. Therefore, any or all of the appropriate models for these manufacturing processes may be selected at 502 depending upon the specific analysis to be performed.

At 504, the process identifies the design to be analyzed. The action may be used, for example, to identify a new design that is to be routed for the first time, a previous design that has already been routed for which the route needs to be verified, or a previous route that is to be optimized.

At 506, the process predicts the physical attributes of the as-manufactured layout objects and uses those predicted physical attributes to determine predicted variations. The integrated circuit design is analyzed based upon the predicted physical attributes and variations. This analysis can be used to verify a proposed routing design and to ensure that the as-manufactured routing structures will be physically and functionally appropriate for the as-designed intent of the routing structures and circuitry. The analysis can also be used to select the specific routing design that will be used for the IC layout. For example, if there are multiple alternate designs, then the analysis can be used to determine which of the alternate design possibilities should be selected. In addition, the analysis can be used to optimize existing routing structures and parameters.

Figure 6:
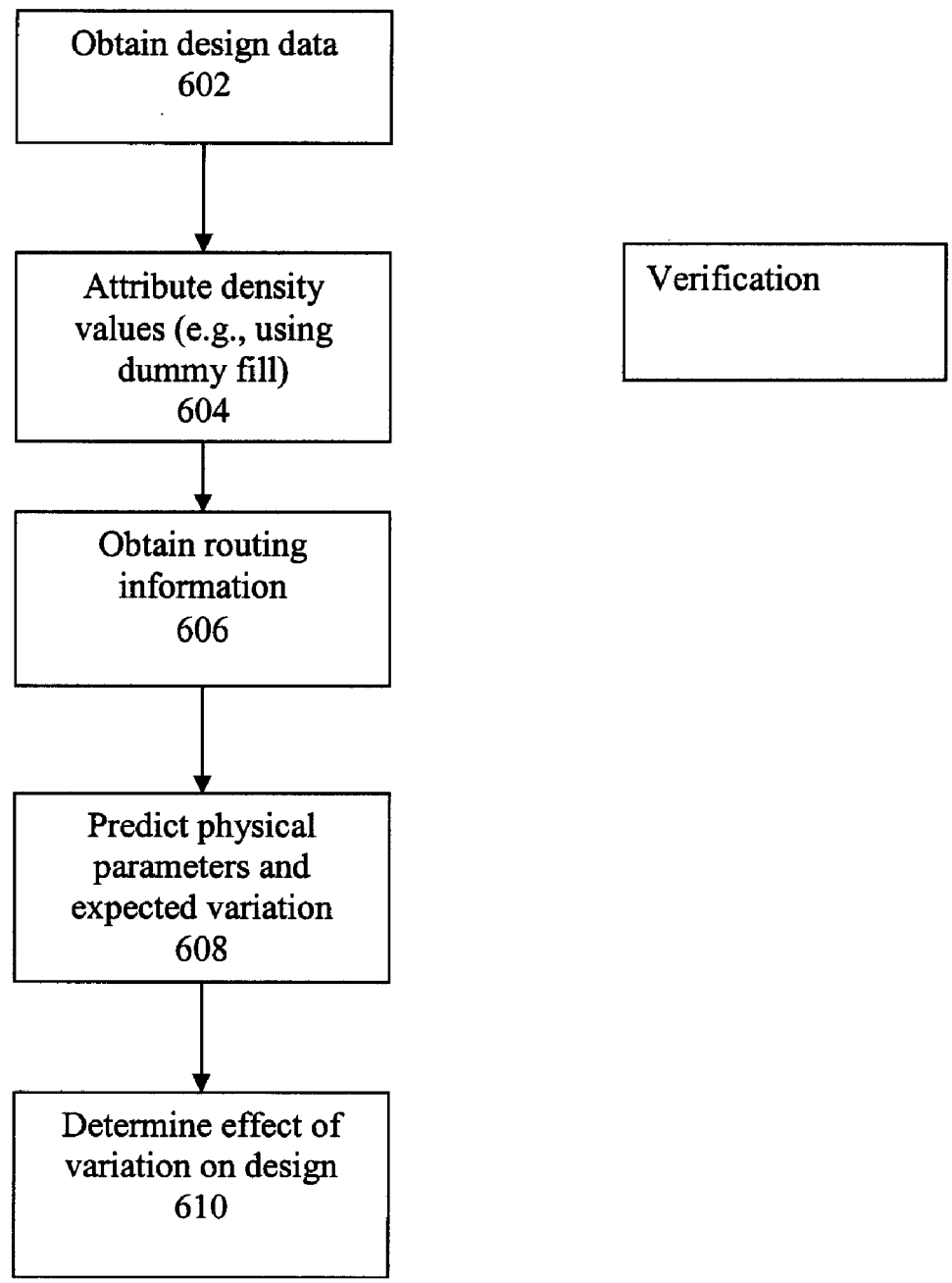
FIG. 6 shows a flowchart of a process for verifying a routing design according to some embodiments of the invention.

FIG. 6 shows a flowchart of a process for verifying a routing design according to some embodiments of the invention. At 602, design data for the integrated design is obtained. The method assumes that design data either exists or can be created for objects/blocks that exist in the layout. The design data that is used at this point may differ depending upon the type of manufacturing processes that is to be analyzed. For example, consider if the invention is directed to analyzing a routing design based upon an awareness of expected thickness characteristics for the as-manufactured IC which incorporates that routing design. Example information that is obtained for this type of analysis could include, for example, (x, y) coordinate information for the layout objects, line width information, density information, and perimeter data. This information may be extracted from actual design data or may be identified as target information, e.g., based upon simulation, rules, prior designs, etc.

At an early stage of the design process, it could be that open areas exist in the layout. According to some embodiments of the invention at 604, open areas are addressed by attributing an expected density value to the open areas. This can be performed, for example, by prescribing some type of simulated fill or dummy fill having given line width, density, and perimeter values for the open areas.

Routing information is then acquired for the IC design at 606. This information is acquired, for example, by performing either global or detail routing upon the layout. Alternatively, the information may be acquired by importing routing information based upon routing that has already occurred previously, e.g., with an external routing tool. For the portions of the layout that has undergone routing and now includes routing objects/polygons, the method goes into the existing set of design data values and replaces existing data corresponding to the location of the routes with updated values based upon the routing information that has been acquired.

At 608, the manufacturing models are used to predict the as-manufactures physical attributes of the layout and to predict expected variations associated with those physical attributes.

At 610, the predicted physical attributes and expected variations are analyzed to determine the effects of the variations on the performance and/or functionality of the as-manufactured IC product. This determination is used to verify the design of the routing circuitry and whether or not any modifications are needed to improve yield IR performance of the IC design. Some thickness-related problems that may occur for the routing objects and could be detected using this method include, for example, resistance based effects from thickness variations, capacitance problems for uneven topological results of polishing, unacceptable variations in the shape of wire objects and lines, and underpolish effects that lead to the creation of copper pools.

In some embodiments, thickness models are used to perform thickness and thickness variation predictions for the routing design. The thickness predictions are reviewed to determine the effect of the extracted thickness variations upon the routes in the layout, e.g., by verifying whether timing will be excessively affected by the predicted thickness variations. For example, a post-route layout can be analyzed to determine whether the design is expected to fail timing requirements. If so, then the design is returned for timing optimization and corrections.

One example approach for performing thickness and thickness variation predictions is disclosed in U.S. application Ser. No. 11/005,651, filed on Dec. 6, 2004, which is hereby incorporated by reference in its entirety.

Figure 7:
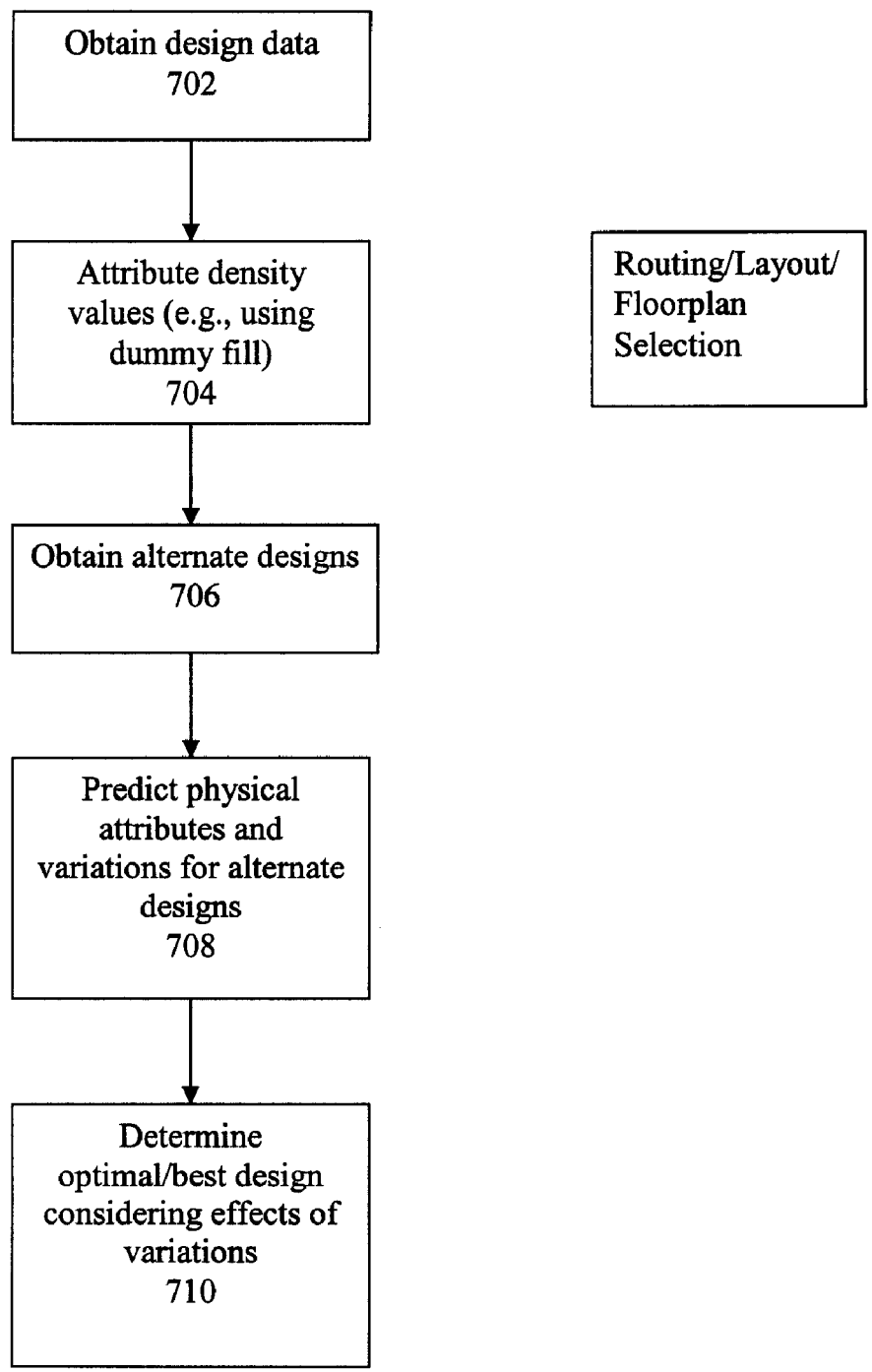
FIG. 7 shows a flowchart of a process for selecting a routing/layout/floorplan design according to some embodiments of the invention.

Some embodiments of the invention can be used to select parameters for a floorplan, layout, or route based upon a ranges of alternative design parameters. FIG. 7 shows a flowchart of a process for selection of a routing, layout, or floorplan design according to some embodiments of the invention. At 702, design data for the integrated design is obtained. As before, the method assumes that design data either exists or can be created for objects/blocks that exist in the layout. The design data that is used at this point may differ depending upon the type of manufacturing processes that is to be analyzed. For example, if the invention is directed to analyzing a routing design based upon an awareness of expected thickness characteristics for the as-manufactured IC which incorporates that routing design, then example information that is obtained for this type of analysis could include, for example, (x, y) coordinate information for the layout objects, line width information, density information, and perimeter data. This information may be extracted from actual design data or may be identified as target information, e.g., based upon simulation, rules, prior designs, etc.

According to some embodiments of the invention at 704, open areas in the design are addressed by attributing an expected density value to the open areas. This can be performed, for example, by prescribing some type of fill or dummy metal fill having a given line width, density, and perimeter vales for the open areas.

Different alternatives for routing designs are acquired for the IC design at 706. The information for the different alternatives can be acquired, for example, by performing either global or detail routing upon the layout with different parameters or thresholds, e.g., for design rules. Alternatively, the information may be acquired by importing routing information based upon routing that has already occurred previously, e.g., with an external routing tool.

At 708, the manufacturing models are used to predict the physical attributes for the as-manufactured IC products for the different alternate designs. In addition, the method will predict the expected variations associated with those physical attributes for the alternate designs.

At 710, the predicted physical attributes and expected variations for the alternate designs are analyzed to determine the best choice of the alternate designs to implement for the IC design. The chosen design could be selected, for example, based upon the design having the highest predicted yield, performance, or a combination of yield and performance.

The invention can be employed for optimization purposes. For this purpose, several alternate/different routing configurations may be run through the method and undergo optimization before selecting a final configuration. The specific configuration having the best expected yield/performance, based upon the analysis, will be selected for the final routing configuration.

Figure 8:
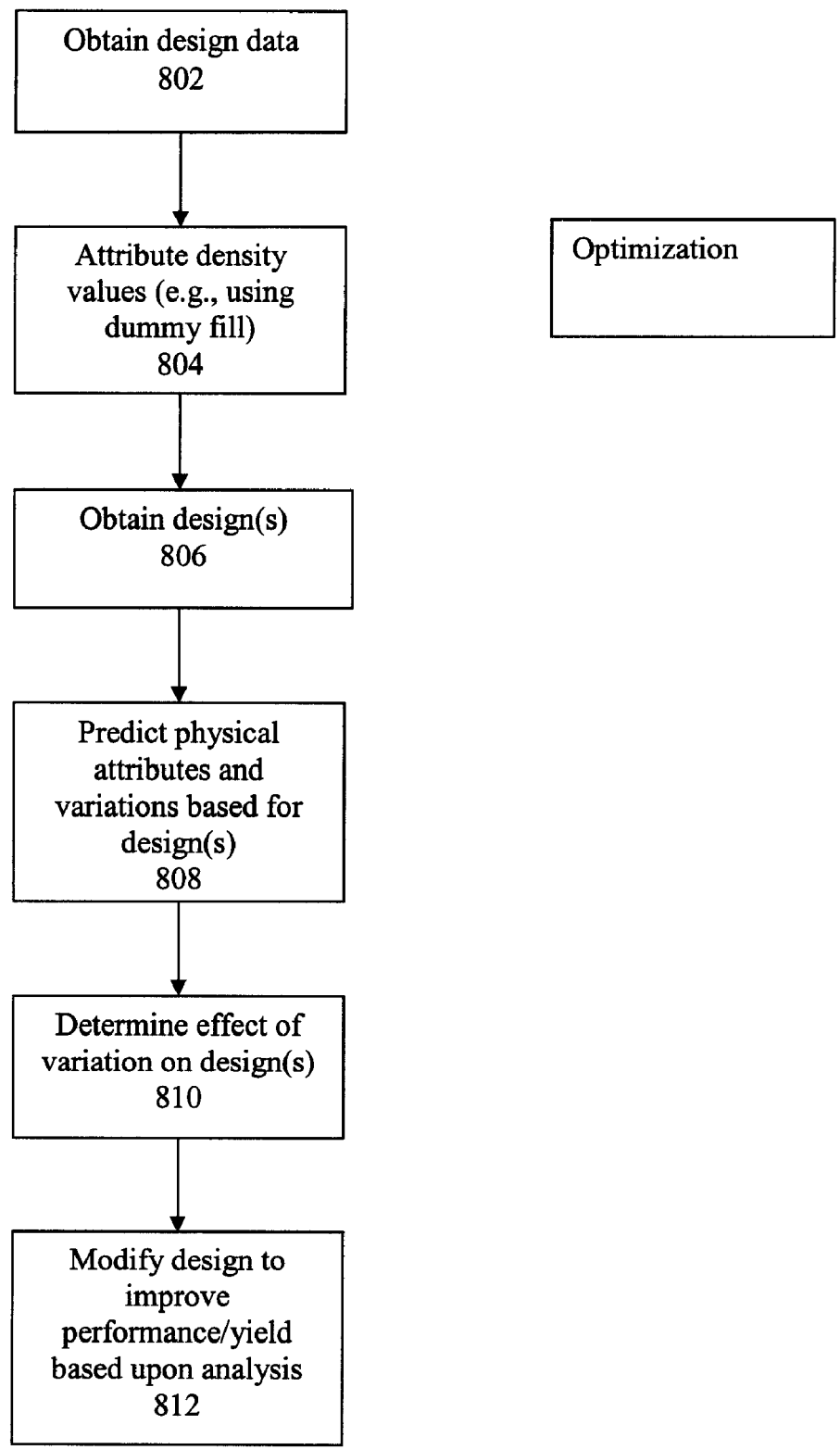
FIG. 8 shows a flowchart of a process for optimizing a routing design according to some embodiments of the invention.

FIG. 8 shows a flowchart of a process for optimizing a routing, layout, or floorplan design according to some embodiments of the invention. At 802, design data for the integrated design is obtained. As before, the method assumes that design data either exists or can be created for objects/blocks that exist in the layout. The design data that is used at this point may differ depending upon the type of manufacturing processes that is to be analyzed. For example, if the invention is directed to analyzing a routing design based upon an awareness of expected thickness characteristics for the as-manufactured IC which incorporates that routing design, then example information that is obtained for this type of analysis could include, for example, (x, y) coordinate information for the layout objects, line width information, density information, and perimeter data. This information may be extracted from actual design data or may be identified as target information, e.g., based upon simulation, rules, prior designs, etc.

According to some embodiments of the invention at 804, open areas in the design are addressed by attributing an expected density value to the open areas. This can be performed, for example, by prescribing some type of fill or dummy metal fill having a given line width, density, and perimeter vales for the open areas.

Different alternatives for routing designs are acquired for the IC design at 806. The information for the different alternative routing designs can be acquired, for example, by performing either global or detail routing upon the layout with different parameters or thresholds, e.g., for design rules. Alternatively, the information may be acquired by importing routing information based upon routing that has already occurred previously, e.g., with an external routing tool.

There may be a constraint that any configuration options evaluated by the models must first meet the design rules. In this approach, the design rules are used as constraints for the model based optimization. There may also be situations where the design rules are not used as constraints to determine potential benefits of modifying or eliminating a particular design rule. There may also be situations where the design rules are used as soft constraints to determine potential benefits of adjustments of a particular design rule. The possible routing configuration options for analysis may include one or more parameters such as wire width, wire edge spacing, adjacency issues, distances between routing and other IC features such as blocks, wire locations intra-level or inter-level, set of global routing decisions or a set of detailed routing decisions.

At 808, the manufacturing models are used to predict the physical attributes for the as-manufactured IC products for the different alternate designs. In addition, the method will predict the expected variations associated with those physical attributes for the alternate designs. At 810, the predicted physical attributes and expected variations for the alternate designs are analyzed to determine the effect of changed parameters on the manufactured IC product. At 812, the routing design is modified to improve the yield and/or performance of the routing design based upon the results of the analysis from 810.

Figure 9:
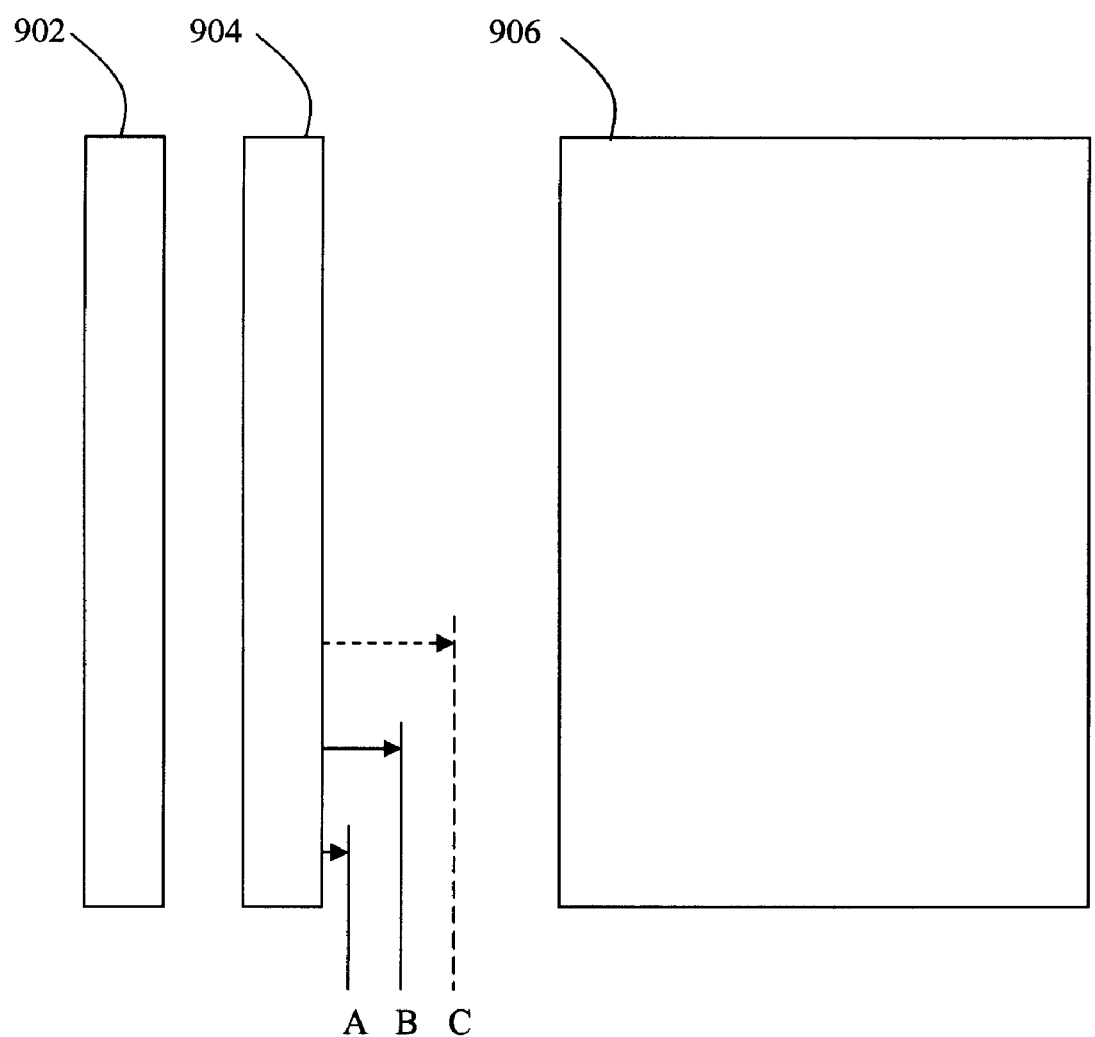
FIG. 9 illustrates application of a process for model-based routing according to some embodiments of the invention.

To illustrate this aspect of the invention, consider the configuration of layout objects shown in FIG. 9. Two wire objects 902 and 904 are placed in close proximity to each other, with wire object 904 also placed nearby object 906. Assume that it is desired to perform a wire spreading operation to widen the spacing distance between wire objects 902 and 904. Further assume that a first proposed distance to widen the wire objects is to widen at distance "A." A second proposed distance is to widen the wire objects at a distance "B."

Figure 10:
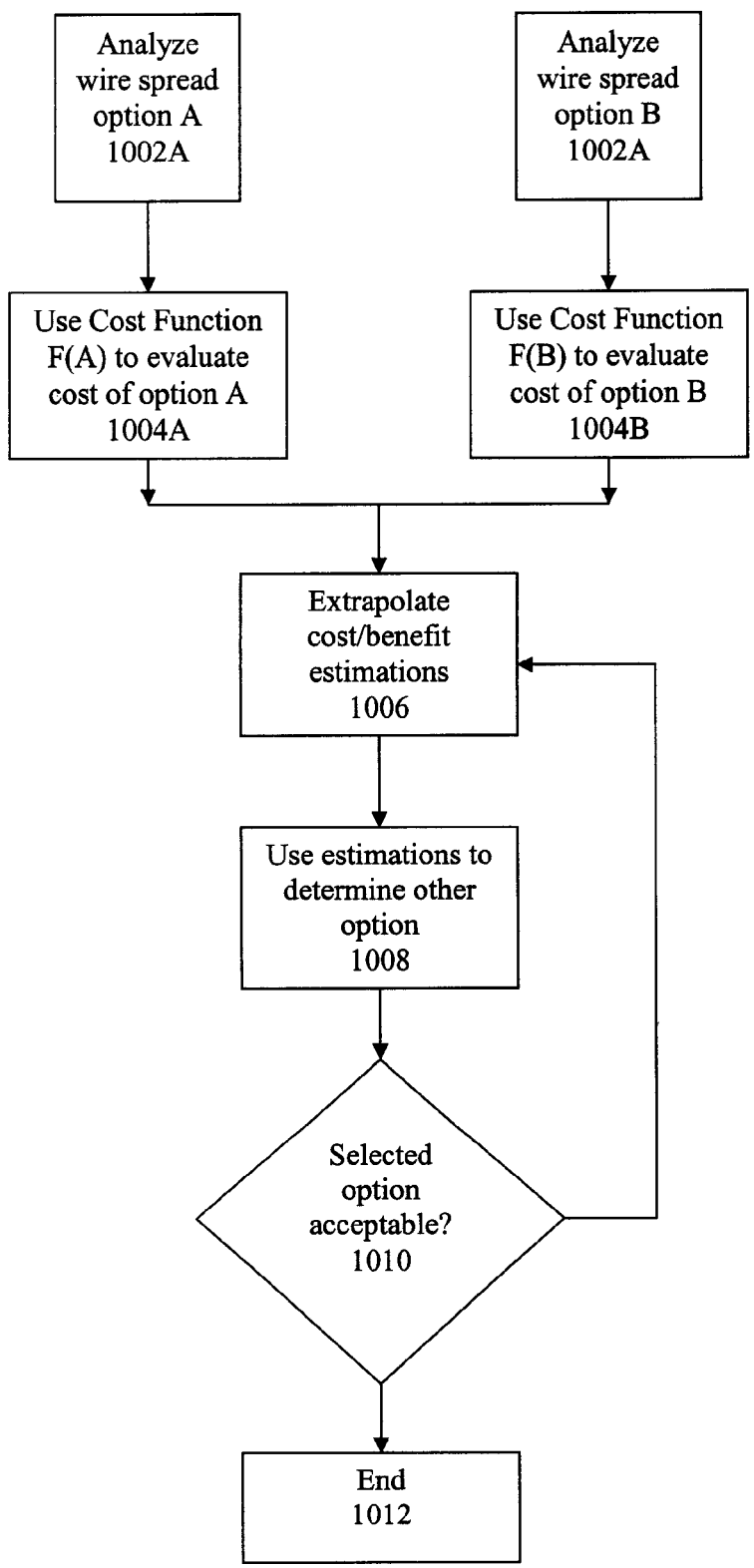
FIG. 10 shows a flowchart of a process for selecting a routing design according to some embodiments of the invention.

Referring to FIG. 10, the manufacturing models are used to evaluate the as-manufactured physical attributes and variations associated with each proposed wire spread distance A (1002A) and B (1002B). These values are used with one or more wire spread cost functions, in which the cost of distance A is compared against the cost of distance B (1004A and 1004B).

The one or more cost functions will be used to evaluate and extrapolate the expected cost and benefit of each optional wire spread distance, with the cost expressed as a function of the expected yield and/or functional result for each option (1006). At this point, it can be determined which of the optional distances A or B is the better option for the desired characteristics of yield and/or functionality. In general, the cost function may be used to evaluate the model-based physical or electrical attributes for one or more routing options such as wire width, wire edge spacing, adjacency issues, distances between routing and other IC features such as blocks, wire locations intra-level or inter-level, set of global routing decisions or a set of detailed routing decisions. For some applications, the cost functions may expressed as quadratic functions based on one or more parameters.

Next, the extrapolated values are used to determine other optional wire spread distances (1008). This can be performed by calculating a gradient between the two distances to establish a yield/performance graph for wire spread distances to further optimize the wire spread distance.

The calculated gradient is used to determine another proposed value, e.g., distance "C", that is expected to produce an even better result than either "A" or "B". The distance C is analyzed with respect to the manufacturing models to determine if it really does provide a better cost value relative to the better of A or B. The results are analyzed to further improve the calculated gradient and cost function parameters. If the result of C is better than A or B, then it is either kept or used to find an even better value. If the results are worse than A or B (e.g., the as-manufactured product with distance C violates a spacing rule relative to object 906), then it is discarded or used to find another better value. The method may loop through several iterations of this before selecting an acceptable "optimal" choice for the wire spread distance (1012). Example approaches for implementing cost functions that is useable in conjunction with embodiments of the invention are described in U.S. application Ser. No. 11/005,651, filed on Dec. 6, 2004, Ser. No. 11/678,592, filed on Feb. 24, 2007, Ser. No. 11/678,593, filed on Feb. 24, 2007, and Ser. No. 11/678,594, filed on Feb. 24, 2007, which are hereby incorporated by reference in their entirety.

The invention may also be used to examine the sensitivity of a set of given routing configuration option as a function of the model-based processing. In this mode, multiple options are evaluated as shown in FIG. 10 and the cost function is used to choose the configuration that is least sensitive to manufacturing variation, as characterized by the models.

The invention may also perform a sampling of configuration values to reduce the impact of local minima or to determine an initial condition for gradient optimization. An alternative might use a larger sampling of configuration options to determine the region that best meets the cost function evaluation and then perform local minimization using the gradient method described. Generation and evaluation of a sampling of configurations may also be useful with a parallel processing computer system where each routing option is evaluated on a separate processor, the results of the set are analyzed with cost functions and a selection of one of the configurations is made. This process may iterate and may do so using the last selected configuration as the comparison benchmark for the next iteration. In some implementations, the last selected configuration can be used to generate the set of possible configurations for the next iteration. The potential parallel processing computing options would include multi-threaded configuration, multi-server based farms, or special purpose hardware. In general, the method could be used with iterative optimization methods such as gradient-based, batch optimization methods as described in this paragraph or a combination thereof.

The invention can be used to perform full chip predictions. Alternatively, the invention may be applied to performed incremental predictions, e.g., to determine the effects of isolated changes to the routing in the IC design.

The invention may be run in many different modes. For example, the analysis may be performed with considerations of numerous combinations of manufacturing processes, such as (i) CMP, (ii) CMP with plating, (iii) CMP, plating, and etch; and/or (iv) CMP, plating, etch, and litho.

The invention may also be used to guide detailed routing once global routing has been performed.

System Architecture Overview

Figure 11:
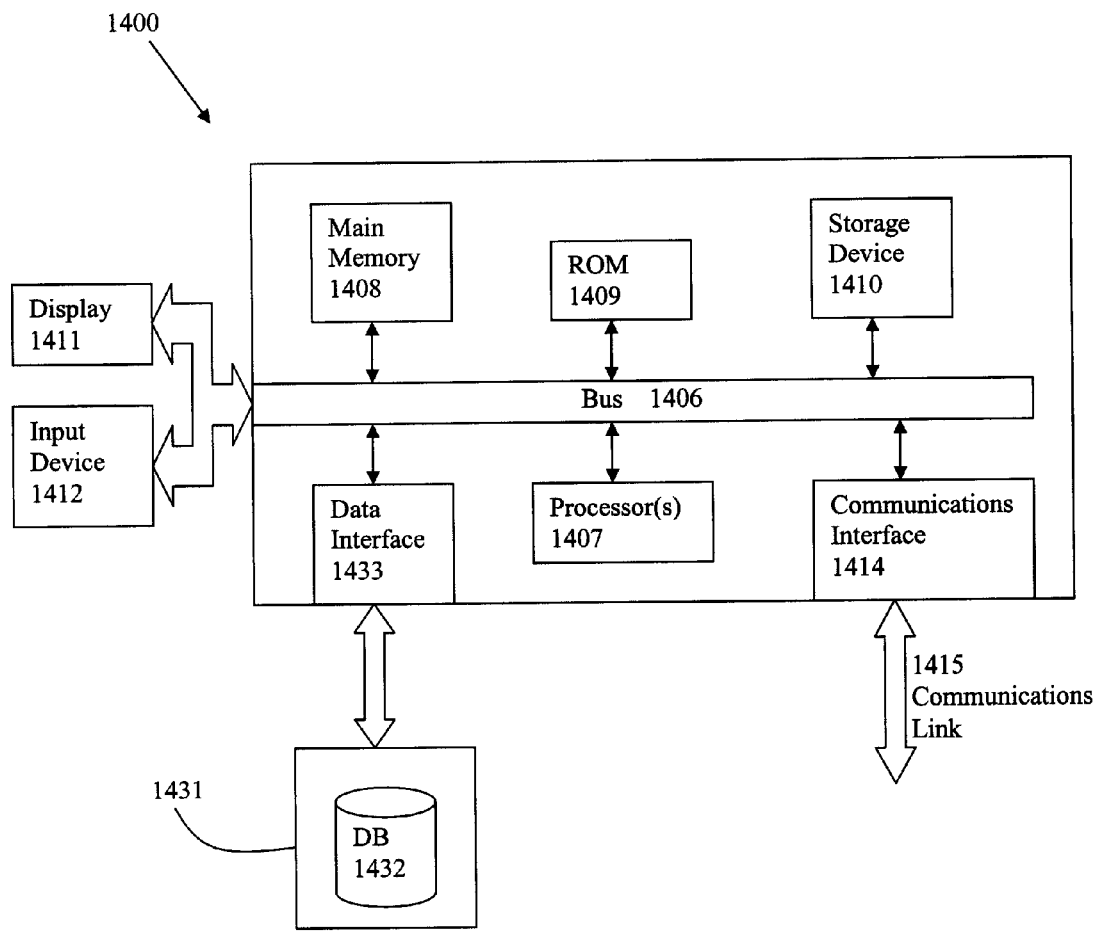
FIG. 11 shows an architecture of an example computing system with which the invention may be implemented.

FIG. 11 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media, volatile media, and transmission media. Non-volatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, e.g., application code, through communication link 1415 and communication interface 1414. Received program code may be executed by processor 1407 as it is received, and/or stored in disk drive 1410, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

The invention claimed is:

1. A computer implemented method for generating and modifying routing for an electronic design, comprising:
   using at least one processor that is to execute a sequence of instructions stored on a non-transitory computer readable storage medium to perform a process, the process comprising:
   determining a set of routing options for a portion of the electronic design using a set of design rules;
   predicting results of each combination of a range of possible combinations for the portion of the electronic design using model-based processing associated with one or more parameters that correspond to manufacturability of the portion of the electronic design, in which the each combination corresponds to a routing option in the set, at least one of the one or more parameters, and a layout portion of multiple portions of a layout of the electronic design;
   evaluating the results using a cost function to determine one or more scores that correspond to manufacturability for at least some of the range of possible combinations; and
   determining an improved combination of the routing option, the at least one parameter, and the layout portion using the results that are evaluated to implement the portion of the electronic design.

2. The computer implemented method of claim 1, in which the routing options comprise at least one parameters selected from wire width, wire edge spacing, adjacencies, distances between routing and other IC features, intra-level wire location, inter-level wire location, global routing decisions or detailed routing decisions.

3. The computer implemented method of claim 1, further comprising:
creating, modifying, replacing or eliminating design rules.

4. The computer implemented method of claim 1, further comprising a critical area analysis to characterize or improve yield.

5. The computer implemented method of claim 1, in which manufacturing variations are predicted.

6. The computer implemented method of claim 5, in which the electronic design is optimized based upon addressing the predicted manufacturing variations.

7. The computer implemented method of claim 6, in which the predicted manufacturing variations comprise one or more of the following variations: thickness, width, or an electrical impact.

8. The computer implemented method of claim 1, in which the model-based processing is based at least in part upon one or more models which correspond to one or more of the following manufacturing processes: chemical mechanical polishing, etch, lithography, or deposition.

9. The computer implemented method of claim 1, further comprising consideration of sensitivity, scoring, or hotspots related to one or more portions of the electronic design.

10. The computer implemented method of claim 1, further comprising:
identifying a portion of the electronic design for the model based processing based at least in part upon sensitivity of the portion of the electronic design.

11. A computer program product that includes a non-transitory computer readable storage medium having stored thereupon a plurality of computer instructions which, when executed by at least one processor, cause the at least one processor to execute a process for generating and modifying the routing for an electronic design, the process comprising:
using the at least one processor that is to execute the plurality of computer instructions stored on the non-transitory computer readable storage medium to perform the process, the process further comprising:
determining a set of routing options for a portion of the electronic design using a set of design rules;
predicting results of each combination of a range of possible combinations for the portion of the electronic design using model-based processing associated with one or more parameters that correspond to manufacturability of the portion of the electronic design, in which the each combination corresponds to a routing option in the set, at least one of the one or more parameters, and a layout portion of multiple portions of a layout of the electronic design;
evaluating the results using a cost function to determine one or more scores that correspond to manufacturability for at least some of the range of possible combinations; and
determining an improved combination of the routing option, the at least one parameter, and the layout portion using the evaluation results to implement the portion of the electronic design.

12. The computer program product of claim 11, the process further comprising:
creating, modifying, replacing or eliminating one or more design rules.

13. The computer program product of claim 11, the process further comprising:
performing a critical area analysis to characterize or improve yield.

14. The computer program product of claim 11, the process further comprising:
performing a predictive analysis to generate one or more predicted manufacturing variations.

15. The computer program product of claim 11, the process further comprising:
performing a predictive analysis to generate one or more predicted manufacturing variations.

16. The computer program product of claim 11, the process further comprising:
identifying a portion of the electronic design for the model based processing based at least in part upon sensitivity of the portion of the electronic design.

17. A system for generating and modifying the routing for an electronic design, comprising:
at least one processor that is to:
determine a set of routing options for a portion of the electronic design using a set of design rules;
predict results of each combination of a range of possible combinations for the portion of the electronic design using model-based processing that is associated with one or more parameters that correspond to manufacturability of the portion of the electronic design, in which the each combination corresponds to a routing option in the set, at least one of the one or more parameters, and a layout portion of multiple portions of a layout of the electronic design;
evaluate the results using a cost function to determine one or more scores that correspond to manufacturability for at least some of the range of possible combinations; and
determine an improved combination of the routing option, the at least one parameter, and the layout portion using the evaluation results to implement the portion of the electronic design.

18. The system of claim 17, the at least one processor configured for performing the process, the process further comprising:
creating, modifying, replacing or eliminating one or more design rules.

19. The system of claim 17, the at least one processor configured for performing the process, the process further comprising:
performing a critical area analysis to characterize or improve yield.

20. The system of claim 17, the at least one processor configured for performing the process, the process further comprising:
performing a predictive analysis to generate one or more predicted manufacturing variations.

21. The system of claim 17, the at least one processor configured for performing the process, the process further comprising:
performing a predictive analysis to generate one or more predicted manufacturing variations.

22. The system of claim 17, the at least one processor configured for performing the process, the process further comprising:
identifying a portion of the electronic design for the model based processing based at least in part upon sensitivity of the portion of the electronic design.

* * * * *